United States Patent [19]
Palmer, Jr. et al.

[11] Patent Number: 5,786,691
[45] Date of Patent: Jul. 28, 1998

[54] DETECTION OF THERMAL DAMAGE IN COMPOSITE MATERIALS USING LOW FIELD NUCLEAR MAGNETC RESONANCE TESTING

[75] Inventors: Donald D. Palmer, Jr., Chesterfield; Ronald D. Stoddard; Mark S. Conradi, both of St. Louis, all of Mo.

[73] Assignee: McDonnell Douglas Corporation, St. Louis, Mo.

[21] Appl. No.: 791,812

[22] Filed: Jan. 30, 1997

[51] Int. Cl.$^6$ ........................................... G01V 3/00
[52] U.S. Cl. ........................................... 324/300; 324/307
[58] Field of Search ........................................ 324/300, 303, 324/307, 309, 306

[56] References Cited

U.S. PATENT DOCUMENTS

| | | | |
|---|---|---|---|
| 5,321,358 | 6/1994 | Mohr et al. | 324/300 |
| 5,408,181 | 4/1995 | Dechene et al. | 324/300 |
| 5,650,722 | 7/1997 | Smith et al. | 324/300 |

*Primary Examiner*—Louis M. Arana
*Attorney, Agent, or Firm*—Robert Westerlund

[57] ABSTRACT

Thermal damage in resin-matrix composite materials is detected using a low field NMR nondestructive testing technique. The technique involves subjecting the resin-matrix composite material to an NMR measurement of the spin-lattice relaxation ($T_1$) at a low magnetic field strength and/or the spin-lattice relaxation of local field order ($T_{LD}$) at any field strength. Thermal damage is evident as an increase in $T_1$ and $T_{LD}$.

16 Claims, 3 Drawing Sheets

DETECTION OF THERMAL DAMAGE IN COMPOSITE MATERIALS USING LOW FIELD NUCLEAR MAGNETC RESONANCE TESTING

BACKGROUND OF THE INVENTION

1. Field of the Invention.

The present invention relates to a method for non-destructively detecting thermal damage in composite materials, and in particular, to a low field nuclear magnetic resonance (NMR) nondestructive testing method for characterizing thermal damage in resin-matrix composite materials by measuring a spin-lattice relaxation ($T_1$) at a low magnetic field and/or by measuring a spin-lattice relaxation of local field order ($T_{1D}$) at any field strength.

2. Description of the Related Art

Current methods used to inspect for thermal damage in composite materials, such as aircraft wings, include ultrasonic measurements and evaluation of Barcol hardness, and often involve removal of surface coatings.

For example, it is common to evaluate a damaged area using ultrasonic testing to look for delaminations, and then to take core plugs to a laboratory for differential scanning calorimetry (DSC) or thermomechanical analysis (TMA). The data collected from these core plugs is used to determine the extent of the repair required. As well as being destructive, this process is expensive, and in the case of testing for thermal damage in aircraft wings, the process adds significantly to the down time of the aircraft.

Also, conventional techniques are typically unable to detect thermally induced damage at levels which result in reduced interlaminar shear properties prior to the onset of failure.

It is noted that two recently developed techniques, although not yet accepted into practice, include diffuse reflectance Fourier transform infrared (DRIFT) techniques and laser-pumped fluorescence (LPF).

In light of the foregoing, there exists a need for a nondestructive method for detecting thermally induced damage in composite materials, and particularly for a nondestructive method capable of detecting micro-mechanical changes in resin-matrix composites caused by exposure to elevated temperatures.

SUMMARY OF THE INVENTION

The present invention is therefore directed to a method for nondestructively detecting thermally induced damage in composite materials which substantially overcomes one or more of the problems caused by the limitations and disadvantages of the related art.

The invention is directed to characterizing thermal damage in resin-matrix composite materials using low field NMR nondestructive testing techniques. The present invention subjects the resin-matrix composite material to an NMR measurement of the spin-lattice relaxation ($T_1$) at a low magnetic field strength and/or the spin-lattice relaxation of local field order ($T_{1D}$) at any field strength. Thermal damage is evident as an increase in $T_1$ and $T_{1D}$.

The NMR technique of the invention can detect lower levels of thermally induced composite damage than conventional methods. In addition, the NMR data may be collected non-destructively and without removal of surface coatings such as paint and primer. The invention is also advantageous in that it gives indications of reduced interlaminar shear properties prior to the onset of failure.

To achieve these and other advantages, and in accordance with the purpose of the invention as embodied and broadly described, the invention provides for a nondestructive method for detecting thermal damage in a specimen, comprising subjecting the specimen to an NMR evaluation to obtain at least one of a spin-lattice relaxation value and a spin-lattice relaxation of local order value, and comparing the thus obtained value or values to data indicative of a relationship between a magnitude of the obtained value or values and thermal damage of the specimen.

The invention also provides for a method for preparing comparison data for use in the nondestructive detection of thermal damage in a specimen, comprising subjecting each of a plurality of like test specimens to a respective plurality of different elevated temperatures extending over a given temperature range, the temperature range including temperatures at which the specimen would suffer thermal damage, and, after cooling of each test specimen, subjecting each test specimen to an NMR evaluation to obtain at least one of a spin-lattice relaxation value and a spin-lattice relaxation of local order value for each specimen, wherein the obtained value or values for each specimen is correlated with the elevated temperature of the specimen to form the comparison data, and wherein an increase in the value or values with an increase in temperature is indicative of thermal damage.

It is noted that NMR nondestructive testing techniques have successfully been developed for inspection of adhesive bondlines, rubber products and rocket propellant. Other possible uses of this technique include detection of moisture, fuel leaks and corrosion under non-ferromagnetic coatings. Copending U.S. patent application of Snyderman et al., entitled "Method and Apparatus For Detecting Corrosion Under Non-Ferromagnetic Coatings", filed Aug. 19, 1996, describes using NMR to detect corrosion under non-ferromagnetic coatings, and is incorporated herein by reference.

DETAILED DESCRIPTION OF THE PREFERRED EMBODIMENT

The low field nuclear magnetic resonance (NMR) nondestructive testing method of the present invention characterizes thermal damage in resin-matrix composite materials. Generally, this is accomplished by measuring the spin-lattice relaxation ($T_1$) at a low magnetic field strength and/or by measuring the spin-lattice relaxation of the local field order ($T_{1D}$) at any field strength. As explained in detail below, thermal damage is evident as an increase in $T_1$ and $T_{1D}$.

Figure 1:
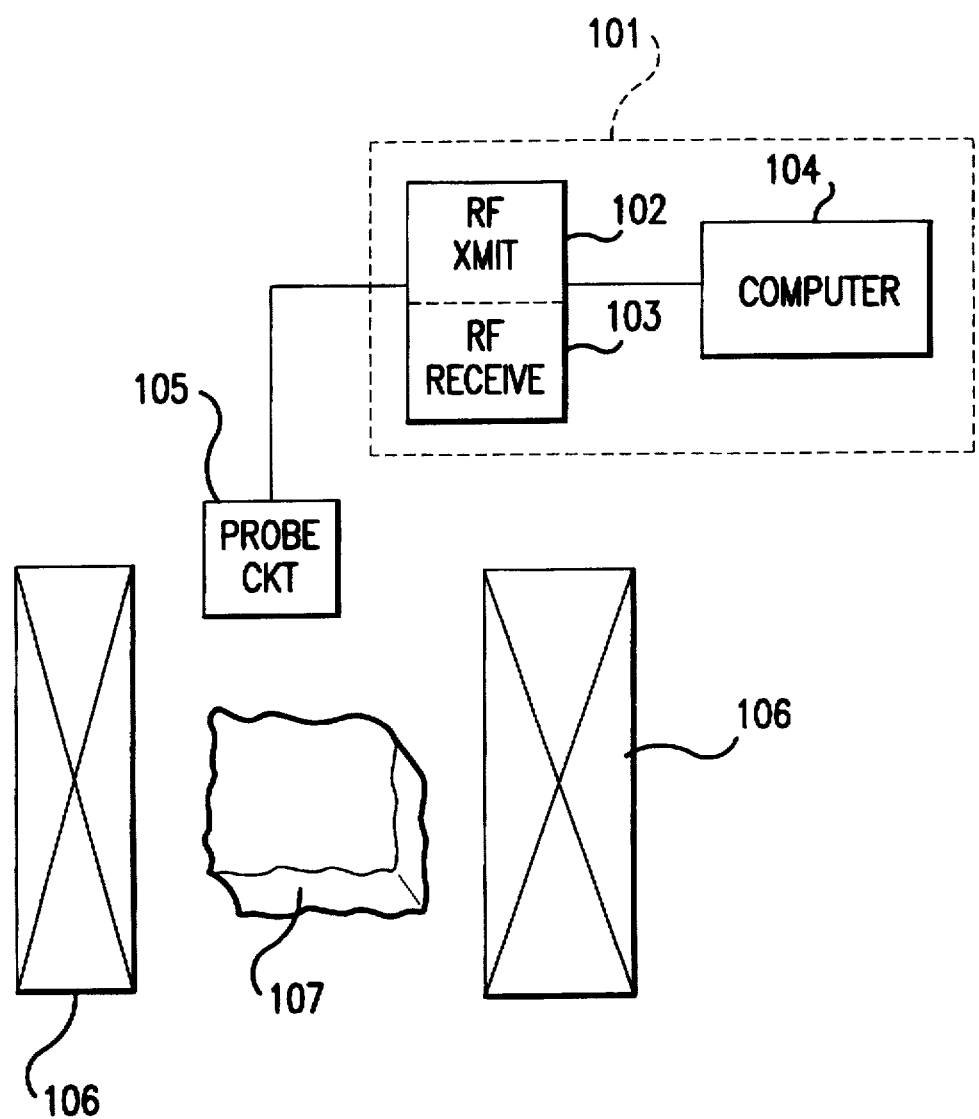
FIG. 1 is a block diagram of the basic component parts of an NMR measurement system used in the method of the present invention.

An exemplary NMR measurement system that may be used to carry out the technique of the present invention is illustrated in FIG. 1. The system includes an NMR spectrometer 101, composed of a radio frequency (RF) receiver 102 and transmitter 103, and a data control/acquisition computer 104. A probe circuit 105 couples the RF electronics to and from the nuclear spins (the same probe circuit is ordinarily, but not necessarily, used to transmit and receive RF). In addition, a magnet 106 provides the uniform static field needed for spin resonance within the specimen 107. The magnet 106 may be a permanent, electro- or superconducting magnet. The computer 104 controls the pulse sequence used for determining $T_1$ and $T_{1D}$, and the computer 104 also analyzes the data obtained to determine the measured values of $T_1$ and $T_{1D}$.

In the NMR measurements described below, the magnet type was an $^{19}F$ (fluorine) NMR stabilized electromagnet, and the RF coil type was a solenoid. Further, the coil diameter and number of windings, which impact signal-to-noise, were one-half inch and 20 turns, respectively. The magnetic field strengths were in the 0.1–2.0 Tesla range, and the pulse sequences used were saturation recovery with a magic echo inspection sequence for measuring $T_1$ and Jeener-Broekaert for measuring $T_{1D}$ (in this regard, it was found that some other sequences were less sensitive to molecular motion).

An evaluation of AS4/3501-6 carbon/epoxy interlaminar shear test specimens was performed using static magnetic fields. As mentioned above, the magnetic field ranged from 0.1 to 2.0 Tesla (5–85 MHz for hydrogen). Further, as also mentioned above, the measurements were made using NMR stabilized electromagnets and solenoid RF coils. The specimens were ovenheated prior to the NMR evaluation using an exposure temperature range of 350°–650° F., with step increases of about 25°–5020 F. The exposure time at each step increase was 10 minutes for all specimens. That is, one specimen was heated to a given elevated temperature, say 350° F., for 10 minutes, and then allowed to cool to nominal temperature prior to being subjected to the NMR evaluation. A next specimen was heated to a next given elevated temperature, say 375° F., and then allowed to cool to a nominal temperature prior to being subjected to the NMR evaluation. In this manner, each specimen was subjected to oven-heating at a different elevated temperature, and then, after cooling, subjected to the NMR evaluations described below.

To correlate the AS4/3501-6 results with those collected from specimens from a damaged AV-8B Harrier II wing, hydrogen spin-lattice relaxation times ($T_1$) were measured using a magnetic field strength of 2.0 Tesla (85 MHz). The results, presented in FIG. 2, show that the $T_1$ values increase with increasing exposure up to 500° F. and then decrease with increasing exposure.

Figure 2:
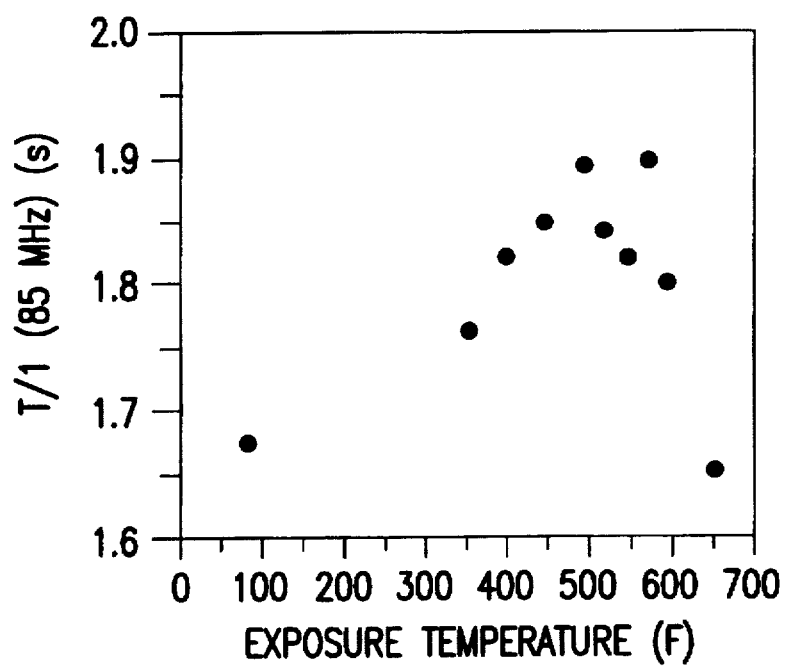
FIG. 2 shows temperature correlated hydrogen NMR spin-lattice data measured at 2.0 Tesla (85 MHz)

It is believed that two different effects are responsible for the $T_1$-exposure temperature characteristics shown in FIG. 2. First, the increasing slope of FIG. 2 is attributed to a reduction of molecular mobility resulting from additional cross-linking which causes an increase in $T_1$. Second, the decreasing slope of FIG. 2 is attributed to the creation of broken hydrogen bonds (free radicals) which causes a decrease $T_1$.

Figure 3:
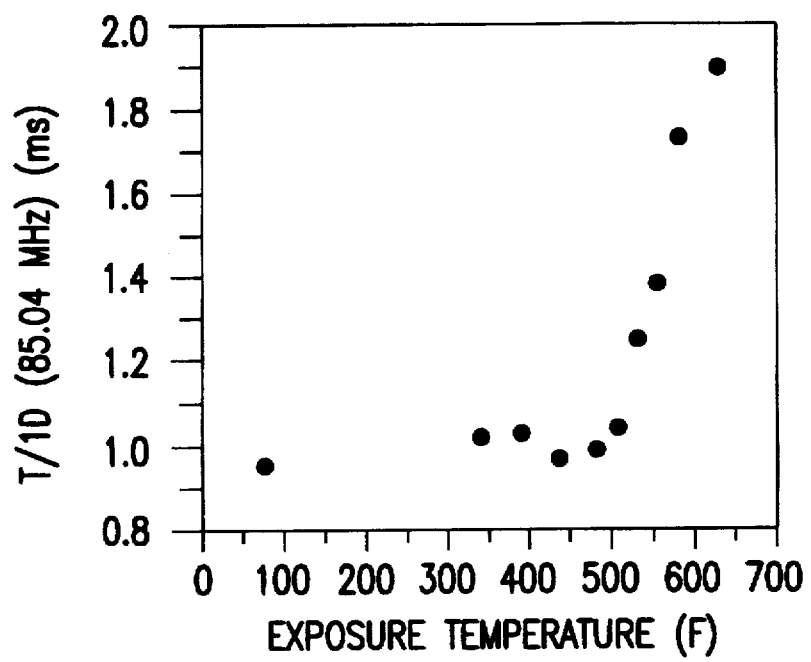
FIG. 3 shows temperature correlated hydrogen NMR spin-lattice relaxation data (local field order) measured at 2.0 Tesla (85 MHz)

Another spin-lattice relaxation measurement was performed at 85MHz. This time, however, the parameter measured, noted as $T_{1D}$, is the delay time constant of local field order. $T_{1D}$ is essentially equivalent to $T_1$ measured in zero external field, where the spins would be exposed only to the local fields generated by their neighboring spins. The results, shown in FIG. 3, were generated at 85 MHz. Coincident with the trend at higher frequencies, the $T_{1D}$ values are much smaller than the $T_1$ values discussed previously. These $T_{1D}$ values, however, exhibit a substantial increase (approximately by a factor of two) at the higher exposure temperatures. This measurement clearly identified the post-cure effect.

Figure 4:
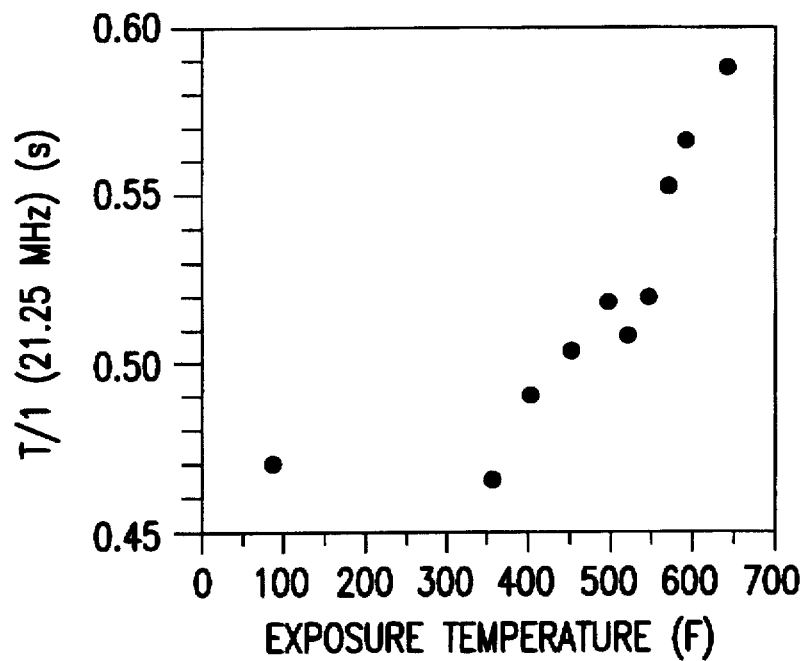
FIG. 4 shows temperature correlated hydrogen NMR spin-lattice relaxation data measured at 0.5 Tesla (21.25 MHz)

For practical inspection purposes, a monotonic response to the extent of thermal damage is preferred. It is believed that the reduced molecular motion effect would be more apparent at the lower frequencies and correspondingly lower external field strength. The measurements performed at 21.25 MHz (0.5 Tesla), shown in FIG. 4, bear out this assumption. The measured $T_1$ values were smaller than those of FIG. 2, roughly by a factor of three. More importantly, however, is the fact that the $T_1$ values of FIG. 4 increase steadily (apart from statistical variations) with increasing exposure temperature. The range of variation is approximately 25%, thus making the changes readily detectable.

Figure 5:
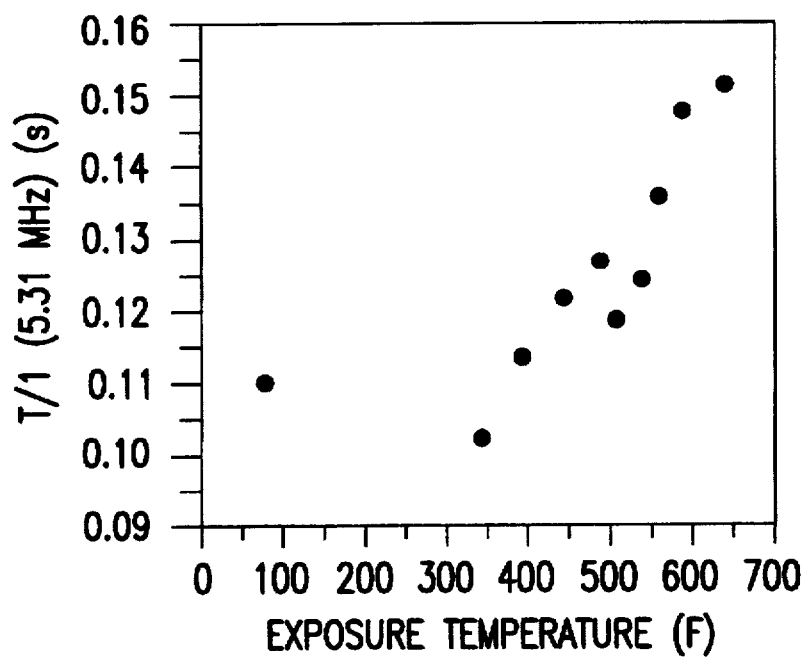
FIG. 5 shows temperature correlated hydrogen NMR spin-lattice relaxation data measured at 0.125 Tesla (5 MHz).

This trend was pursued further by measuring hydrogen $T_1$ values at 5.31 MHz (0.125 Tesla). A low field such as this is more typical of those required for a practical inspection device. Thus, it is believed that these 5.31 MHz $T_1$ values are most relevant to an eventual in-service application of the technique of the present invention. As shown in FIG. 5, the $T_1$ values at 5.31 MHz are much smaller than those measured at 21.25 MHz. More important, the fractional variation of the $T_1$ values at 5.31 MHz with the extent of thermal damage is larger, approximately 40%.

As should now be readily apparent, the demonstrated correlation between thermal damage and measured $T_1$ values and/or $T_{1D}$ values can form the basis for the detection of thermal damage in a specimen to be tested. For example, the specimen may be subjected to NMR testing to measure the hydrogen $T_1$ value at, for example, 5.31 MHz (0.125 Tesla). The measured $T_1$ value is then compared with previously measured hydrogen NMR spin-lattice relaxation data measured over a range of exposure temperatures. For example, in the case of AS4/3501-6 carbon/epoxy, the measured $T_1$ value would be compared to the data of FIG. 5, in which a measured $T_1$ value in excess of about 0.12–0.13 would be suggestive of thermal damage.

Field strengths other than 0.125 Tesla may of course be used for measurement and comparison purposes, and the spin-lattice relaxation of local field order ($T_{1D}$) at any field strength may be applied. In addition, for verification and increased reliability, a combination of two or more field strengths and/or $T_1$ and $T_{1D}$ values may be adopted.

As described above, the low field nuclear magnetic resonance (NMR) nondestructive testing technique of the present invention characterizes thermal damage in resin-matrix composite materials. Thermal damage is evident as an increase in $T_1$ and $T_{1D}$.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

Having thus described our invention, what we claim as new and desire to secure by letters patent is as follows:

1. A nondestructive method for detecting thermal damage in a specimen which is already manufactured, comprising subjecting the specimen to an NMR evaluation to obtain at least one of a spin-lattice relaxation value and a spin-lattice relaxation of local field order value, and comparing the thus obtained value or values to data indicative of a relationship between a magnitude of the obtained value or values and thermal damage of the specimen.

2. A method as claimed in claim 1, wherein the specimen is a resin-matrix composite material.

3. A method as claimed in claim 2, wherein the NMR evaluation includes measuring a spin-lattice relaxation value at a low magnetic field strength.

4. A method as claimed in claim 3, wherein the low magnetic field strength is in a range of 0.1 to 2.0 Tesla.

5. A method as claimed in claim 2, wherein the NMR evaluation includes measuring the spin-lattice relaxation of local field order.

6. A method for preparing comparison data for use in the nondestructive detection of thermal damage in a specimen which is already manufactured, comprising subjecting each of a plurality of like test specimens to a respective plurality of different elevated temperatures extending over a given temperature range, the temperature range including temperatures at which the specimen would suffer thermal damage, and, after cooling of each test specimen, subjecting each test specimen to an NMR evaluation to obtain at least one of a spin-lattice relaxation value and a spin-lattice relaxation of local field order value for each specimen, wherein the obtained value or values for each specimen is correlated with the elevated temperature of the specimen to form the comparison data, and wherein an increase in the value or values with an increase in temperature is indicative of thermal damage.

7. A method as claimed in claim 6, wherein each specimen is a resin-matrix composite material.

8. A method as claimed in claim 7, wherein the NMR evaluation includes measuring a spin-lattice relaxation value at a low magnetic field strength.

9. A method as claimed in claim 8, wherein the low magnetic field strength is in a range of 0.1 to 2.0 Tesla.

10. A method as claimed in claim 7, wherein the NMR evaluation includes measuring the spin-lattice relaxation of local field order.

11. A method for detecting thermal damage in an already-manufactured specimen made of a composite material, including the steps of:

using an NMR measurement device positioned completely external to the specimen to obtain NMR data about the specimen; and, using the NMR data to detect thermal damage in the specimen.

12. The method as set forth in claim 11, wherein the specimen comprises an aircraft part.

13. The method as set forth in claim 11, wherein the composite material comprises a resin-matrix composite material.

14. The method as set forth in claim 11, wherein the step of using an NMR measurement device is performed using a low magnetic field strength.

15. The method as set forth in claim 14, wherein the low magnetic field strength is in a range of 0.1 to 2.0 Tesla.

16. The method as set forth in claim 11, wherein the NMR data includes at least one of a spin-lattice relaxation value and a spin-lattice relaxation of local field order value of the composite material.

* * * * *